(12) United States Patent
Grover et al.

(10) Patent No.: US 6,689,692 B1
(45) Date of Patent: *Feb. 10, 2004

(54) COMPOSITION FOR OXIDE CMP

(75) Inventors: Gautam S. Grover, Aurora, IL (US);
Brian L. Mueller, Aurora, IL (US);
Shumin Wang, Naperville, IL (US)

(73) Assignee: Cabot Microelectronics Corporation, Aurora, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,894

(22) Filed: Dec. 19, 1997

Related U.S. Application Data

(63) Continuation-in-part of application No. 08/774,488, filed on Dec. 30, 1996, now Pat. No. 5,759,917.

(51) Int. Cl.[7] .............................................. H01L 21/302
(52) U.S. Cl. ...................... 438/691; 438/692; 438/693; 51/307; 51/308; 51/309; 252/79.1; 252/79.2
(58) Field of Search ........................ 51/307, 308, 309; 438/692, 693; 252/79.1, 79.2

(56) References Cited

U.S. PATENT DOCUMENTS

| | | | |
|---|---|---|---|
| 4,383,857 A | 5/1983 | Steeves et al. ................. 106/3 |
| 4,752,628 A | 6/1988 | Payne ........................ 523/122 |
| 4,769,073 A | 9/1988 | Tastu et al. .................... 106/3 |
| 4,867,757 A | 9/1989 | Payne ......................... 51/293 |
| 4,944,836 A | 7/1990 | Beyer et al. ................. 438/633 |
| 4,959,113 A | * 9/1990 | Roberts ....................... 216/89 |
| 5,114,437 A | 5/1992 | Takeuchi et al. .............. 51/293 |
| 5,244,534 A | 9/1993 | Yu et al. ..................... 438/672 |
| 5,264,010 A | 11/1993 | Brancaleoni et al. ......... 51/308 |
| 5,340,370 A | 8/1994 | Cadien et al. ................ 51/308 |
| 5,354,490 A | 10/1994 | Yu et al. .................... 252/79.1 |
| 5,382,272 A | 1/1995 | Cook et al. ................... 51/293 |
| 5,389,352 A | 2/1995 | Wang ......................... 423/263 |
| 5,391,258 A | 2/1995 | Brancaleoni et al. ......... 216/89 |
| 5,480,476 A | 1/1996 | Cook et al. .................... 106/3 |
| 5,575,837 A | * 11/1996 | Kodama et al. ............ 252/79.1 |
| 5,697,992 A | * 12/1997 | Ueda et al. .................. 51/307 |
| 5,700,383 A | * 12/1997 | Feller et al. ............... 252/79.1 |
| 5,770,095 A | * 6/1998 | Sasaki et al. ................ 438/692 |
| 5,773,364 A | * 6/1998 | Farkas et al. ............... 438/692 |
| 5,783,489 A | * 7/1998 | Kaufman et al. ........... 252/79.2 |
| 5,804,513 A | * 9/1998 | Sakatani ..................... 438/693 |
| 5,863,838 A | * 1/1999 | Farkas et al. ............... 438/693 |
| 6,063,306 A | * 5/2000 | Kaufman et al. ........... 252/79.4 |
| 6,083,419 A | * 7/2000 | Grumbine et al. .......... 251/79.1 |
| 6,136,711 A | * 10/2000 | Grumbine et al. ............. 216/89 |

OTHER PUBLICATIONS

NYACOL Colloidal Ceria Nitrate MSDA (Nov. 17, 1994).

* cited by examiner

Primary Examiner—Nadine G. Norton
Assistant Examiner—Duy-Vu Deo

(57) ABSTRACT

A chemical mechanical polishing composition comprising a soluble cerium compound at a pH above 3 and a method to selectively polish a silicon oxide overfill in preference to a silicon nitride film layer in a single step during the manufacture of integrated circuits and semiconductors.

29 Claims, 1 Drawing Sheet

COMPOSITION FOR OXIDE CMP

This application is a continuation-in-part of U.S. patent application Ser. No. 08/774,488 filed on Dec. 30, 1996 now U.S. Pat. No. 5,759,917.

BACKGROUND OF THE INVENTION

1. Field of the Invention

The present invention relates to chemical mechanical polishing slurries for semiconductor integrated circuit substrates. Specifically, this invention is a CMP slurry having a unique chemistry that is especially suitable for chemical mechanical planarization where a high silicon dioxide removal rate, and a low silicon nitride removal rate are required on the same substrate.

2. Description of the Related Art

Integrated circuits (IC) are made up of millions of active devices formed in or on a silicon substrate. The active devices form functional circuits and components. These devices are then connected by the use of multilevel metallized interconnects and vias. Interconnection structures normally have a first layer metallization, an interconnect plug, a second layer of metallization, and sometimes a third or more layers of metallization with their respective interconnects. Inter level dielectrics (ILDs), such as doped and undoped SiO2 are used to electrically isolate the different levels of interconnections.

Shallow trench isolation (STI) is a technology for device isolation in a give layer in the IC manufacturing process. In the STI process, silicon nitride is deposited on thermally grown oxide. After deposition of the nitride, a shallow trench is etched into the substrate using a mask. A layer of oxide is then deposited into the trench so that the trench forms an area of insulated dielectric which acts to isolate the devices in a chip, and thus reduces the cross-talk between active devices. The excess deposited oxide must be polished of and the trench planarized to prepare for the next level of metallization. The silicon nitride is applied to the silicon to prevent polishing of the masked silicon oxide of the device.

In a typical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as "a CMP slurry", is flowed onto the pad during polishing. The chemicals and abrasive particles in the slurry initiate the polishing process by interacting with the wafer being polished. The polishing process is facilitated by the rotational movement of the pad relative to the substrate as slurry is provided to the wafer/pad interface. Polishing is continued in this manner until the final desired film thickness is achieved by removal of the required amount of thin-film material.

When polishing oxides, it is desirable of the slurry used to have a high removal rate towards the oxide layer and a low removal rate towards other layers which may be exposed during CMP, such as silicon nitride. The polishing slurry should be tailored to provide effective polishing at the desired polishing ranges selective to specific thin layer materials, while minimizing, at the same time, surface imperfections, defect, corrosion, erosion and the removal of silicon nitride and other stop layers.

CMP slurries useful for polishing oxides typically contain an abrasive at an alkaline or high pH. These slurries either rely on potassium hydroxide or ammonium hydroxide to effectively buffer the high pH. While these slurries polish silica at high rates they also polish silicon nitride at high rates. Typically, the ratio of these removal rates, i.e., the selectivity is, at most, about 5 to 1 silicon oxide to silicon nitride. It is believed that the mechanism of silicon nitride polishing is oxidative hydrolysis of the nitride to the oxide in an aqueous environment. At alkaline pH this oxide and nitride are similarly etched at a high rate. Thus, present CMP slurries undesirably polish silicon nitride at an unacceptably high rate.

There remains a need in the semiconductor industry for CMP slurries that have greater than a 5 to 1 oxide to nitride selectivity. Accordingly, new CMP slurries that selectively remove the oxide at high rates while leaving the stop layer of silicon nitride relatively intact are needed to overcome the present manufacturing problems, increase throughput and reduce costs of the CMP process. This is because a low selectivity process, when used in a manufacturing environment, will necessarily suffer overpolishing—in thinner film parts of the wafer—and the nitride stop layer will not prevent breakthrough to the underlying thin film(s).

SUMMARY OF THE INVENTION

This invention is a chemical mechanical polishing composition that is capable of polishing a silicon dioxide layer at a high rate.

This invention is also a chemical mechanical polishing composition that inhibits the polishing of a silicon nitride film.

In addition, this invention is a method of using a chemical mechanical polishing composition that selectively removes silicon dioxide from a substrate while leaving a silicon nitride layer associated with the substrate essentially intact.

In one embodiment, this invention is a chemical mechanical polishing composition comprising carboxylic acid, a salt and a soluble cerium compound. The composition has a pH from about 3.0 to about 11, and preferably from about 3.8 to about 5.5 and is useful for selectively removing silicon dioxide from layered substrates.

In another embodiment, this invention is a chemical mechanical polishing slurry comprising the chemical mechanical polishing composition described above and an abrasive. The slurry is especially useful for silicon dioxide film polishing.

In still another embodiment, the present invention is a method for using a chemical mechanical polishing composition comprising a carboxylic acid, a salt and a soluble cerium compound in an aqueous solution having a pH from about 3.0 to about 11 to selectively remove oxide overfill in preference to a silicon nitride film layer during the manufacture of integrated circuits and semiconductors.

DESCRIPTION OF THE CURRENT EMBODIMENTS

Figure 1:
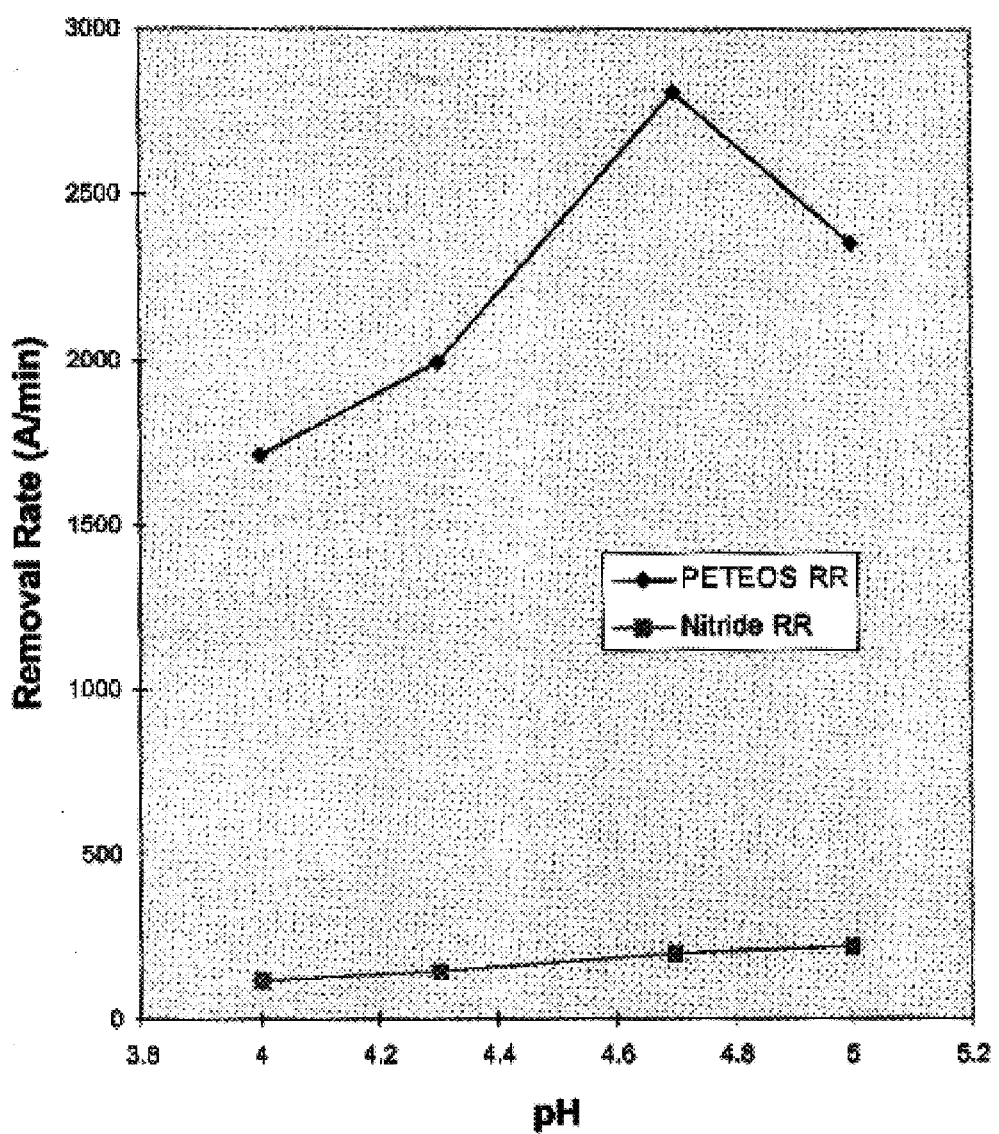
FIG. 1—Plot of pH versus PETEOS removal rate and nitrate removal rate.

The present invention is directed to a chemical mechanical polishing composition that comprises, a carboxylic acid, a salt, and a soluble cerium compound, having a pH of from about 3.0 to about 11.0. The chemical mechanical composition may be used alone or it may be combined with a metal oxide abrasive to form a slurry. The compositions and slurries of this invention polish oxide layers such as silicon dioxide layers associated with substrates at high rates. In addition, the compositions of this invention have been found to inhibit silicon nitride polishing. The present invention is also directed to novel methods for using the compositions and slurries of this invention to polish oxide layers.

Before describing the details of the various preferred embodiments of this invention a term that is used herein will be defined. The "chemical mechanical composition" refers to the combination of at least one carboxylic acid, at least one salt, and at least one soluble cerium compound that may be used in conjunction with an abrasive pad to remove one or more layers of a substrate. The term "slurry" or "chemical mechanical polishing slurry" refers to the combination of the chemical mechanical polishing composition and at least one abrasive.

Carboxylic acids useful in a CMP slurry of the present invention include monofunctional and di-functional carboxylic acids and their salts. Preferably, the carboxylic acid is selected from the group including acetic acid, adipic acid, butyric acid, capric acid, caproic acid, caprylic acid, citric acid, giutaric acid, glycolic acid, formic acid, fumaric acid, lactic acid, lauric acid, malic acid, maleic acid, malonic acid, myristic acid, oxalic acid, palmitic acid, phthalic acid, propionic acid, pyruvic acid, stearic acid, succinic acid, tartaric acid, valeric acid, 2-(2-methyoxyethoxy) acetic acid, 2-[2-(2- methyoxyethoxy)ethyoxy]acetic acid, poly (ethylene glycol)bis(carboxymethyl)ether, and derivatives, including salts thereof. A most preferred carboxylic acid is acetic acid.

In the composition of the present invention, the carboxylic acid can comprise greater than 10% of the slurry. In a preferred embodiment, the carboxylic acid is present in the composition of this invention in an amount ranging from about 0.05 to about 10% by weight. In a more preferred embodiment, however, the carboxylic acid is present in the composition of this invention in an amount ranging from about 0.1 to about 3%.

The chemical mechanical composition of the present invention may include a salt. The term "salt" refers to any water soluble salts including organic salts and inorganic salts such as nitrate, phosphate, and sulfate salts. Soluble salts also refers to salts that are only partially or marginally soluble in water. Preferred salts are nitrate salts.

The term "nitrate salt" includes nitric acid. Useful nitrate salts include compositions of the formula $(M)_n(NO_3)_m$ where n and m are both integers. When n=m, M is monovalent and can be alkali earth metals such as Li, Na, K, as well as H, $NH_4$, $NR_4$ where R is an alkyl group having from 1 to 10 or more carbon atoms or is a mixture thereof, including $NMe_4$, $NBu_4$ and so forth. When n≠m, then M is a multivalent cation or metal or a combination of a multivalent cations and monovalent cations. One known preferred nitrate salt is ammonium cerium nitrate, $(NH_4)_2Ce(NO_3)_6$.

The salt may be present in the composition in the amount of from about 0.05 to about 6% by weight of the composition. It is most preferred that the salt is present in the composition in the amount ranging from about 0.1 to about 4% by weight.

The chemical mechanical composition of the present invention includes at least one soluble cerium compound. The term "soluble cerium" includes, for purposes of this invention, both cerium added in soluble form and cerium dissolved from colloidal or ground particles. Non-limiting examples of soluble cerium compounds useful in a composition of the present invention include water soluble hydrated and non-hydrated salts of cerium hydroxide (Ce $(OH)_4$), ammonium cerium sulfate, $(NH_4)_2SO_4Ce_2(SO_4)_3$; cerium acetate, $Ce(O_2CH_3)_3$; cerium sulfate, $Ce(SO_4)_2$; cerium bromate, $Ce(BrO_3)_3 \cdot 9H_2O$; cerium bromide, $CeBr_3$; cerium carbonate, $Ce(CO_3)_2$, cerium chloride, $CeCl_3$; cerium oxalate, $Ce(C_2O_4)_3$; cerium nitrate, $Ce(NO_3)_3(OH)$ $\cdot 6H_2O$ and any other known soluble cerium compounds. A preferred soluble cerium compound is ammonium cerium nitrate, $(NH_4)_2Ce(NO_3)_6$. The soluble cerium compound will be present in the composition of this invention in an amount ranging from about 0.05 weight percent to about 10.0 weight percent and preferably from about 0.1 to about 4.0 weight percent.

A preferred embodiment of the chemical mechanical composition of the present invention includes ammonium cerium nitrate as both the salt and as the soluble cerium compound. Other soluble cerium nitrate salts may be incorporated into the composition of this invention as both the soluble cerium compound and as the salt. Ammonium cerium nitrate may be present in composition of the present invention in an amount ranging from about 0.05 to about 6% weight percent of the overall composition weight. A more preferred range of ammonium cerium nitrate is from about 0.1 to about 4.0 weight percent.

Commercially available colloidal ceria typically contains a mixture of dissolved $Ce^{4+}$ and $Ce^{3+}$ ions. It is preferred that the dissolved ceria is in the form of $Ce^{3+}$ ions. Adding an oxidizer to the composition of this invention that is capable of oxidizing $Ce^{3+}$ to $Ce^{4+}$ produces a product that exhibits high oxide selectivities and low nitride selectivities. The oxidizing agent used must have a higher oxidation potential than $Ce^{4+}$. A preferred oxidizing agent is ammonium persulfate. The oxidizing agent is useful in an amount ranging from about 0.05 to about 5.0 weight percent. The oxidizing agent is preferably present in an amount ranging from about 0.1 to about 2.0 weight percent.

The chemical mechanical composition of this invention may optionally include at least one chelating agent. It has been found that the addition of a chelating agent to chemical mechanical compositions of this invention improves the cleanability of substrates polished with compositions of this invention. It is believed that cleanability of substrates is enhanced because the chelating agent binds free ions in the composition that would otherwise deposit on the wafer.

Useful chelating agents include any chelating agents that bind to free ions in the compositions of this invention. Examples of useful chelating agents include, but are not limited, to polycarboxylic acids such citric acid, EDTA, triethanolamine, and benzonitrile, adipic acid, malonic acid, oxalic acid, phoshonic acids, phosphoric acid and salts thereof. Chelating agents, if used, should be present in the composition in an amount ranging from about 0.05 to about 5.0 weight percent, and preferably from about 0.1 to about 1.5 weight percent.

The chemical mechanical composition of this invention may be used alone or in conjunction with an abrasive to give a chemical mechanical polishing "slurry." Abrasives useful in conjunction with the compositions of the present invention include metal oxide abrasives. The metal oxide abrasive may be selected from the group including alumina, titania, zirconia, germania, silica, ceria and mixtures thereof. In addition, useful abrasives may be the result of mixing precursors of two or more metal oxides to give a chemical admixture of a mixed metal oxide abrasive. For example, alumina can be co-formed with silica, or combined alumina/silica.

Useful metal oxide abrasives may be produced by any techniques known to those skilled in the art, including high temperature processes such as sol-gel, hydrothermal or, plasma process, or by processes for manufacturing fumed or precipitated metal oxides. Pulverized or crushed metal oxide abrasives are also useful in the CMP slurry of this invention and may be manufactured by milling or grinding using conventional manufacturing techniques such as jet-milling, ball milling, bead milling, and other milling and pulvizeration techniques and process know to one skilled in the art.

Preferred abrasives suitable for the CMP slurries of this invention are silica and cerium oxide (ceria) with fumed silica being most preferred. Other suitable silica abrasives can be made by methods such as sol-gel, hydrothermal, plasma process, flame pyrolysis or by other processes for manufacturing metal oxides.

Pulverized abrasives are also suitable for this invention. Any pulverized metal oxide abrasive may be used in a CMP slurry of this invention. However, pulverized cerium oxide is preferred. The cerium oxide abrasive, is ground in a media mill to give pulverized ceria. The original cerium oxide particle may be either mined cerium oxide or precipitated and calcined cerium oxide or a combination thereof. The grinding may be accomplished in an aqueous medium using any type of a grinding or milling apparatus such as by jet milling or ball milling. A preferred grinding mechanism is a medial mill with either yttria tetragonal zirconia (YTZ) or zirconium silicate media. The grinding process may use a dispersant or steric stabilizer.

The preferred pulverized metal oxide abrasive will have a narrow particle size distribution with a median particle size (i.e., aggregate particle or single particle) of less than about 0.5 microns. The particles may be diluted and filtered after the grinding. Preferably, after filtration, the particle sizes of the pulverized metal oxide abrasive range from about 40 to about 1000 nm, and preferably from about 100 to about 300 nm. The preferred pulverized abrasive should contain less than about 10 weight percent of particles having a median particle size greater than 0.6 $\mu$m.

Precipitated cerium oxide is a suitable abrasive for oxide CMP. Precipitated cerium oxide particles are made from a variety of precursors including acetates, carbonates and hydroxide and nitrate salts of cerium. The median particle size of precipitated cerium oxide particles may range of from about 10 nm to about 500 nm, with the preferred size of precipitated cerium oxide particles being in the range of from about 30 to about 300 nm.

Another preferred abrasive is fumed silica. The production of fumed metal oxides is a well-known process which involves the hydrolysis of suitable feed stock vapor (such as silicon tetrachloride for a silica abrasive) in a flame of hydrogen and oxygen. Molten particles of roughly spherical shape are formed in the combustion process. The diameters of the particles are varied through process parameters, and these molten spheres of silica or similar oxide, typically referred to as primary particles, fuse with one another by colliding at their contact points to form branched, three dimensional chain-like aggregates. The force necessary to break aggregates is considerable and often irreversible. During cooling and collecting, the aggregates undergo further collisions that may result in some mechanical entanglement causing the formation of aggregates.

A preferred metal oxide will have a surface area, as calculated from the method of S. Brunauer, P. H. Emmet, and I. Teller, J. Am. Chemical Society, Volume 60, Page 309 (1938) and commonly referred to a BET, ranging from about 5 $m^2$/g to about 430 $m^2$/g and preferably from about 30 $m^2$/g to about 170 $m^2$/g. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

In a preferred embodiment, the metal oxide abrasive consists of metal oxide aggregates having about 99 weight percent of the particles less than about 1.0 micron in diameter, a mean aggregate diameter less than about 0.4 micron and a force sufficient to repel and overcome the van der Waals forces between abrasive aggregates themselves. Such metal oxide abrasives have been effective in minimizing or avoiding scratching, pit marks, divots and other surface imperfections during polishing. The aggregate size distribution in the present invention may be determined using known techniques such as transmission electron microscopy (TEM). The mean aggregate diameter refers to the average equivalent spherical diameter when using TEM image analysis, i.e., based on the cross-sectional area of the aggregate. The surface potential or the hydration force of the metal oxide particles must be sufficient to repel and overcome the van der Waals attractive forces between the particles.

In another preferred embodiment, the metal oxide abrasive may consist of discrete metal oxide particles having a particle diameter less than 0.5 micron (500 nm) and a surface area ranging from about 10 $m^2$/g to about 250 $m^2$/g.

A CMP slurry of this invention will include from about 2 weight percent to about 25 weight percent metal oxide abrasive and preferably from about 2 weight percent to about 15 weight percent metal oxide abrasive.

Metal oxide abrasives useful in CMP slurries of the present invention are incorporated into the aqueous medium of the polishing slurry as a concentrated aqueous dispersion of metal oxides comprising from about about 3% to about 55% solids, and preferably between 30% and 50% solids. The aqueous dispersion of metal oxides may be produced using conventional techniques, such as slowly adding the metal oxide abrasive to an appropriate media, for example, de-ionized water, to form a colloidal dispersion. The dispersions are typically completed by subjecting them to high shear mixing conditions known to those skilled in the art.

The abrasives useful in a CMP slurry of the present invention can be a mixture of the abrasives described above. For example, precipitated cerium oxide, pulverized cerium oxide (also referred to a ceria) and fumed silica could be incorporated into a CMP slurry of the present invention. Other combinations of abrasives are also useful in the CMP slurry. In addition, the mixture of abrasives could include any relative proportion of one abrasive to another. For example, a combination of from about 5 to 100 weight percent of the pulverized oxide abrasive described above with from about 0 to about 95 weight percent precipitated abrasive has been found to be effective as a CMP slurry abrasive in STI applications.

Commercially available precipitated cerium oxides sold at a pH of about 1.5, are ineffective as CMP slurries. We have, however, discovered that significantly increasing the pH of the commercially available slurry to about 3.5 results in a CMP slurry that is useful for STI polishing. Furthermore, we have surprisingly discovered that a CMP slurry with the composition and pH disclosed above exhibits a high oxide layer removal rate and low nitride layer removal rate.

The CMP slurry of this invention must have a pH from about 3.0 to about 11.0 to be effective. More preferably, the slurry pH will range from about 3.5 to about 6.0, and most preferably the pH is from about 3.8 to about 5.5. Slurry pH is adjusted by adding any base to the composition and preferably by adding a non-metal base such as ammonium hydroxide to the slurry.

The chemical mechanical composition of this invention may contain one or more buffering agents. The purpose of the buffering agent is to help maintain the pH of the composition within the desired range, and most preferably from about 3.8 to about 5.5.

Any buffering agent that is capable of maintaining the pH of the composition in the desired range may be used. Most preferred buffers are ammonium formate or formic acid. Buffering agent used in the composition will typically range from about 0.01 to about 5.0 weight percent and most preferably from 0.05 to about 0.5 weight percent.

In order to further stabilize a polishing slurry of this invention against settling, flocculation and decomposition of the oxidizing agent, a variety of additional optional additives, such as surfactants, polymeric stabilizers or other surface active dispersing agents, can be used. The surfactant can be anionic, cationic, nonionic, amphoteric and combinations of two or more surfactants can be employed. Furthermore, it has been found that the addition of a surfactant may be useful to improve the within-wafer-non-uniformity (WIWNU) of the wafers, thereby improving the surface of the wafer and reducing wafer defects.

In general, the amount of an additive used, such as a surfactant, in the present invention should be sufficient to achieve effective steric stabilization of the slurry and will typically vary depending on the particular surfactant selected and the nature of the surface of the metal oxide abrasive. For example, if not enough of a selected surfactant is used, it will have little or no effect on stabilization. On the other hand, too much of the surfactant may result in undesirable foaming and/or flocculation in the slurry. As a result, additives like surfactants should generally be present in a range between about 0.001% and 10% by weight. Furthermore, the additive may be added directly to the slurry or treated onto the surface of the metal oxide abrasive utilizing known techniques. In either case, the amount of additive is adjusted to achieve the desired concentration in the polishing slurry.

The chemical mechanical polishing compositions and slurries of this invention are capable of selectively removing the silicon dioxide layer from layered substrates at very high rates. Furthermore, the compositions and slurries of this invention inhibit the polishing of silicon nitride from layered substrates. One important application for the chemical mechanical polishing compositions and slurries of this invention is in the manufacture of integrated circuits and semiconductors. In such a polishing application, the compositions and slurries of this invention effectively remove silicon dioxide for shallow trench device isolation.

The compositions and slurries of this invention preferably exhibit oxide removal rate of from about 1200 Å/min to about 6000 Å/min or more with an oxide to nitride removal selectivity of from about 5 to about 100 or more and preferably from about 15 to about 50 or more.

The compositions and slurries of the present invention may be incorporated in a single package which includes an aqueous composition of at least one carboxylic acid, a soluble cerium compound, a salt, an optional abrasive, and optional additives at the requisite pH. To avoid changes in activity of slurry over time it may be preferable to use at least a two package system where the first package comprises at least one carboxylic acid, a salt and a soluble cerium compound at any pH and the second package comprises the optional abrasive at any pH. These two packages will be engineered so that when they are mixed, the useful composition is in the required pH range. Alternatively, the components in one container may be in dry form while the component in the other container are in the form of an aqueous dispersion. Other two-container combinations of the ingredients of the CMP slurry of this invention are within the knowledge of one having ordinary skill in the area.

At the requisite pH, the compositions and slurries of the present invention do not significantly increase the silicon nitride removal rate. However, the composition and slurry of this invention significantly increases the removal rate of silicon dioxide in comparison to known slurries. The polishing slurry of the present invention may be used during the various stages of semiconductor integrated circuit manufacture to provide effective removal of silicon oxide layers at desired removal rates while minimizing surface imperfections and defects.

EXAMPLE 1

The following examples illustrate preferred embodiments of this invention as well as preferred methods for using compositions of this invention. All compositions and slurries were used in an STI polishing protocol as outlined below.

The CMP slurries were used to chemically-mechanically polish blanket PETEOS and silicon nitride using a IC1000/SUBA IV pad stack manufactured by Rodel, Inc. The polishing was performed using an IPEC/WESTECH 472 CMP tool at a down force of 9 psi, a slurry flow rate of 140 ml/min., a platen speed of 35 rpm and a carrier speed of 24 rpm.

EXAMPLE 2

Pulverized Ceria Formulations

A pulverized ceria slurry was prepared in order to evaluate its ability to polish blanket silicon dioxide and nitride wafers. Rhodite grade 400HS ceria, having particle sizes approximately 2–4 $\mu$m was purchased from Universal Photonics, Hicksville, N.Y. and pulverized using an agitator bead mill to a primary median particle size of 150 nm. Pulverizing was accomplish under wet conditions so that the resulting slurry, pH approximately 7.5–8.5, contained 20–30% solids after the pulverizing process.

The slurry was then diluted and the pH adjusted to produce the slurries listed in Table 1. The slurries were used to polish substrates according to the method described in Example 1.

TABLE 1

| Slurry No. | pH | % solids | PETEOS RR (Å/min) | Nitride RR (Å/min) | Selectivity |
|---|---|---|---|---|---|
| 1 | 8 | 4.0 | 925 | 1050 | 0.89 |
| 2 | 8 | 5.0 | 4337 | 1137 | 3.81 |
| 3 | 8 | 7.5 | 4800 | 1130 | 4.25 |
| 4 | 8 | 10.0 | 5145 | 1153 | 4.46 |
| 5 | 10 | 4.0 | 4342 | 1101 | 3.95 |
| 6 | 10 | 10.0 | 4344 | 1015 | 4.28 |

The pulverized ceria slurries were used for polishing The data indicates that the pulverized slurries yield very high PETEOS (silicon oxide layer) removal rates.

EXAMPLE 3
Precipitated Ceria Nitrate Formulations

A nitrate stabilized ceria slurry containing precipitated ceria particles, nitric acid, acetic acid, pH=1.8 and 20% solids, was purchased from Nyacol Products (Ashland, Mass.). The pH of the slurry was adjusted to from about 4.2–6.8 by adding ammonium hydroxide. The slurries were used to polish substrates according to the method described in Example 1. The polishing results are reported in Table 2.

TABLE 2

| Slurry No. | pH | % solids | Additives | PETEOS RR | Nitride RR | Selectivity |
|---|---|---|---|---|---|---|
| 7 | 4.2 | 20 | | 406 | 14.5 | 28 |
| 8 | 5.8 | 20 | | 281 | 208 | 1.35 |
| 9 | 6.1 | 20 | | 241 | 281 | 0.86 |
| 10 | 6.2 | 20 | | 163 | 354 | 0.46 |

The polishing data indicates that at the lowest pH (4.2) selectivity is high, but overall oxide removal rates are low.

EXAMPLE 4
Precipitated Ceria Acetate Formulations

A colloidal cerium acetate slurry, including soluble $Ce^{3+}$ and $Ce^{4+}$, and acetic acid, (pH=1.8 and 20% solids), was purchased from Nyacol Products (Ashland, Mass.). The pH of the slurry was adjusted to 4.5 and the solids content to 15%. The slurry was applied to substrate according to the methods described in Example 1 and the result showed an oxide layer removal rate of 117 Å/min and a nitride layer removal rate of 10.5 Å/min for an oxide to nitride selectivity of 11.1.

EXAMPLE 5
Crushed/precipitated Ceria Formulations

A ceria slurry, composed of varying weight percent amounts of the pulverized ceria manufactured as set forth in Example 2 and precipitated ceria purchased from Nyacol Products (Ashland, Mass.) was formulated as shown in Table 3. The slurries were used to polish substrates according to the methods described in Example 1 and the polishing results are set forth in Table 3, below.

TABLE 3

| Slurry No. | pH | % total solids | % pulverized ceria in slurry | PETEOS RR (Å/min) | Nitride RR (Å/min) | Selectivity |
|---|---|---|---|---|---|---|
| 11 | 4 | 8 | 20 | 1595 | 108.4 | 14.71 |
| 12 | 4 | 8 | 40 | 2168 | 183.4 | 11.82 |
| 13 | 4 | 8 | 60 | 3356 | 826.5 | 4.06 |
| 14 | 4 | 8 | 80 | 4785 | 209.1 | 22.88 |

The results indicate that a CMP slurry including 80% pulverized ceria and 20% precipitated ceria produced the most desired properties of high PETEOS rates, low nitride rates and high selectivity.

EXAMPLE 6
Chemical Formulation Using Pulverized Ceria

A slurry, composed of L-90, a fumed silica particles manufactured by Cabot Corporation and sold under the trademark CAB-O-SIL®, ammonium cerium nitrate, acetic acid, of varying precentages, and deionized water was formulated as shown in Table 4. All slurries were adjusted to pH=4 after the inclusion of additives. The slurries were applied to substrate according to the methods described in Example 1.

TABLE 4

| Slurry | Weight % silica | Weight % Amm. Cerium Nitrate | Weight % Acetic Acid | Nitride RR (Å/min) | PETEOS RR (Å/min) | Selectivity |
|---|---|---|---|---|---|---|
| 20 | 4 | 0.1 | 0.1 | 58 | 280 | 4.83 |
| 21 | 4 | 0.1 | 1 | 52 | 253 | 4.87 |
| 22 | 4 | 0.65 | 0.5 | 59 | 619 | 10.49 |
| 23 | 4 | 1 | 0.1 | 44 | 1535 | 34.89 |
| 24 | 4 | 1 | 1 | 312 | 1524 | 4.88 |
| 25 | 4 | 1 | 0 | 104.62 | 1337.9 | 12.79 |
| 26 | 4 | 2 | 0.05 | 57.51 | 1103 | 19.18 |
| 27 | 4 | 3 | 0.1 | 89.99 | 835.8 | 9.29 |
| 28 | 4 | 1 | 0.5 | 71.5 | 803.1 | 11.23 |
| 29 | 4 | 2 | 0.1 | 24.1 | 346.6 | 14.38 |
| 30 | 4 | 2 | 0.5 | 71.1 | 768.0 | 10.8 |

High PETEOS removal rates and low nitride removal rates were obtained with high nitrate (1% nitrate) content and low (0.1%) acetic acid content.

EXAMPLE 7
Chemical Formulation Using Silica—pH Test

A slurry, composed of 4 weight percent CAB-O-SIL® L-90 fumed silica, 1.8 weight percent ammonium cerium nitrate, and 0.6 weight percent acetic acid of varying percentages was formulated as shown in Table 5. The pH of the slurries varied from between 4.0 to 5.0. The slurries were applied to substrate according to the methods described in Example 1.

TABLE 5

| Slurry | Weight % silica | pH | Weight % Acetic Acid | Nitride RR | PETEOS RR | Selectivity |
|---|---|---|---|---|---|---|
| 31 | 4 | 4.0 | 0.6 | 114 | 1713.7 | 15.03 |
| 32 | 4 | 4.3 | 0.6 | 141 | 1988.9 | 14.11 |
| 33 | 4 | 4.7 | 0.6 | 199 | 2810.5 | 14.12 |
| 34 | 4 | 5.0 | 0.6 | 219 | 2355 | 10.75 |

High PETEOS removal rates are obtained and selectivity was very good for each slurry. The results indicate that slurry pH has a strong effect on PETEOS removal rate and the optimum removal rate of oxide is achieved at about pH 4.7 (FIG. 1).

While the present invention has been described by means of specific embodiments, it will be understood that modifications may be made without departing from the spirit of the invention. The scope of the invention is not considered to be limited by the description of the invention set forth in the specification and examples, but rather defined by the following claims.

EXAMPLE 8

A composition composed of 1.8 wt % ammonium cerium nitrate, 0.8 wt % acetic acid, and deionized water was used to polish PETEOS and silicon nitride wafers according to the method of Example 1. The pH of the slurry was adjusted to 4.5. The composition polished PETEOS at 690 Å/min and silicon nitride at 23 Å/min, giving a PETEOS selectivity of 3.0.

EXAMPLE 9

A CMP slurry consisting of 4.0 wt % cerium and 4.0 wt % silica, having a pH of 4.5 was prepared by combining appropriate amounts of (1) the 20 wt % colloidal cerium solution manufactured by Nyacol Products (Ashland, Mass.) and described in Example 4; (2) L-90 fumed silica manufactured by Cabot Corp. and sold under the name CAB-O-SIL®; and (3) deionized water. The pH of the slurry was adjusted to 4.5 with ammonium hydroxide. The slurry included 0.15 wt % ammonium persulfate.

Prior to testing, varying amounts of EDTA or citric acid chelating agents were added to the slurry. The slurries were then tested according to the method of Example 1. The test results are reported in Table 6, below.

TABLE 6

| Chelating Agent | Chelating Agent (wt %) | Oxide Removal rate | Nitride Removal rate | Post CMP clean (LPD) |
|---|---|---|---|---|
| EDTA-K | 0 | 3870 | 19 | >20,000 |
| EDTA-K | 0.1 | 2731 | 11 | 977 |
| EDTA-K | 0.2 | 1806 | 12 | 169 |
| EDTA-K | 0.3 | 1381 | 11 | 45 |
| Citric Acid | 0 | 4241 | 20 | 3772 |
| Citric Acid | 0.10% | 2095 | 34 | 516 |
| Citric Acid | 0.20% | 1625 | 68 | 28 |

Increasing the amount of dipotassium EDTA in the slurry decreases the oxide removal rate. However, increasing the dipostassium EDTA concentration significantly decreases the Light Point Defects (LPD) the number of particles on the wafer after post CMP clean.

EXAMPLE 10

This Example evaluated the polishing effectiveness of compositions of this invention without and with an oxidizing agent. Slurries, consisting of 4.0 wt % colloidal ceria including $Ce^{4+}$ ions, and 4.0 wt % silica and having a pH of 4.5 were formulated according to the method set forth in Example 9. The slurries were tested according to the method of Example 2 without and with the addition of 0.15 wt % ammonium persulfate. The test results are reported in Table 7, below.

TABLE 7

| | No Oxidizer | | | With Oxidizer | | |
|---|---|---|---|---|---|---|
| Lot | Oxide Rate (Å/min) | Nitride Rate (Å/min) | Selectivity | Oxide Rate (Å/min) | Nitride Rate (Å/min) | Selectivity |
| 1 | 2822 | 472 | 5.98 | 3255 | 28.9 | 112.6 |
| 2 | 3394 | 373 | 9.10 | 3513 | 22.8 | 154.1 |
| 3 | 3640 | 319 | 11.42 | 3428 | 25.8 | 132.9 |
| 4 | 2929 | 473 | 6.19 | 3711 | 36.1 | 102.8 |
| 5 | 1734 | 856 | 2.02 | 3880 | 46.5 | 83.4 |

The results set forth in Table 7 indicate that, without ammonium persulfate oxidizer, each lot of ceria exhibits different polishing rates and acceptable but low nitride selectivities. The performance of the same lots after the addition 0.15 wt % ammonium persulfate is more consistent and the slurries exhibit high nitride selectivities.

What we claim is:

1. An aqueous chemical mechanical polishing composition comprising:
   the reaction product of from about 0.05 to about 10.0 wt % soluble cerium including $Ce^{3+}$ ions; and
   an oxidizing agent having a oxidation potential greater than $Ce^{4+}$.

2. An aqueous chemical mechanical polishing composition comprising:
   soluble cerium including $Ce^{4+}$ ions;
   an oxidizing agent having a oxidation potential greater than $Ce^{4+}$; and
   at least one nitrate salt.

3. The aqueous chemical mechanical polishing composition of claim 2 having a pH of from about 3.8 to about 5.5.

4. The aqueous chemical mechanical polishing composition of claim 2 wherein the nitrate salt is a compound having the formula:

wherein n and m are both integers and wherein when n=m, M is an alkali earth metal, H, $NH_4$ or $NR_4$ where R is an alkyl group having from 1 to 10 carbon atoms and wherein when n≠m, M is a multivalent cation or metal or a combination of multivalent cations and monovalent cations.

5. The aqueous chemical mechanical polishing composition of claim 2 including from about 0.05 to about 6.0 weight percent nitrate salt.

6. The aqueous chemical mechanical polishing composition of claim 2 wherein the nitrate salt is ammonium cerium nitrate.

7. The aqueous chemical mechanical polishing composition of claim 2 including from about 0.05 to about 10.0 weight percent of at least one carboxylic acid or salt thereof.

8. The aqueous chemical mechanical polishing slurry of claim 7 wherein the carboxylic acid or salt thereof is selected from monofunctional acids, di-functional acids, and salts thereof.

9. The aqueous chemical mechanical polishing slurry of claim 8 wherein the carboxylic acid is acetic acid.

10. The aqueous chemical mechanical polishing composition of claim 2 wherein the oxidizing agent is ammonium persulfate.

11. The aqueous chemical mechanical polishing composition of claim 10 including from about 0.05 to about 5.0 weight percent ammonium persulfate.

12. The aqueous chemical mechanical polishing composition of claim 2 including from about 0.05 to about 10 weight percent colloidal cerium.

13. The aqueous chemical mechanical polishing composition of claim 2 wherein the soluble cerium is at least one compound selected from ammonium cerium sulfate, cerium acetate, cerium sulfate hydrate, cerium hydroxide, cerium bromate, cerium bromide, cerium chloride, cerium oxalate, cerium nitrate, cerium carbonate and mixtures thereof.

14. The aqueous chemical mechanical polishing composition of claim 2 wherein the soluble cerium is ammonium cerium nitrate.

15. The aqueous chemical mechanical polishing composition of claim 2 including from about 0.5 to about 10 weight percent ammonium cerium nitrate.

16. The aqueous chemical mechanical polishing composition of claim 2 including at least one chelating agent.

17. The aqueous chemical mechanical polishing slurry of claim 16 including from about 0.05 to about 5.0 wt % of a chelating agent.

18. The aqueous chemical mechanical polishing slurry of claim 2 including a chelating agent selected from an EDTA salt, citric acid, and mixtures thereof.

19. The aqueous chemical mechanical polishing slurry of claim 2 including at least one buffering agent.

20. A chemical mechanical polishing slurry comprising:
   the reaction product of from about 0.05 to about 10.0 wt % soluble cerium including $Ce^{3+}$ ions and an oxidizing agent having an oxidation potential greater than $Ce^{4+}$;

at least one chelating agent; and at least one abrasive, wherein the composition has a pH of from about 3 to about 11.

21. The chemical mechanical polishing slurry of claim 20, including from about 1 to about 25 weight percent abrasive.

22. The chemical mechanical polishing slurry of claim 21, wherein the abrasive is at least one metal oxide abrasive.

23. The chemical mechanical polishing slurry of claim 22, wherein the metal oxide abrasive is at least one compound selected from the group including alumina, titania, zirconia, germania, silica, ceria or mixture and chemical admixtures thereof.

24. The chemical mechanical polishing slurry of claim 22, wherein the abrasive is a physical mixture of at least two elemental oxides selected from alumina, titania, zirconia, germania, silica, ceria.

25. The chemical mechanical polishing slurry of claim 22, including from about 2 to about 15 weight percent metal oxide abrasive.

26. The aqueous chemical mechanical polishing slurry of claim 20, including from about 0.05 to about 5.0 weight percent of a ammonia persulfate, from about 0.05 to about 5.0 weight percent of at least one chelating agent, and from about 0.5 to about 10 percent soluble cerium.

27. The aqueous chemical mechanical polishing slurry of claim 20 comprising from about 0.05 to about 10 weight percent ammonium cerium nitrate, from about 2.0 to about 15.0 weight percent fumed silica, from about 0.05 to about 5.0 weight percent of at least one chelating agent, and from 0.05 to about 5.0 weight percent ammonium persulfate wherein the slurry has a pH of from about 3.8 to about 5.5.

28. The aqueous chemical mechanical polishing slurry of claim 27 wherein the chelating agent is selected from an EDTA salt, citric acid, and mixtures thereof.

29. The aqueous chemical mechanical polishing slurry of claim 20 including a buffering agent.

* * * * *